(12) United States Patent
Russell

(10) Patent No.: US 9,085,349 B2
(45) Date of Patent: Jul. 21, 2015

(54) INFRARED LIGHT ENABLED AND ELECTROMAGNETIC SHIELDING AIRCRAFT WINDOW

(71) Applicant: The Boeing Company, Chicago, IL (US)

(72) Inventor: Shawn P. Russell, Everett, WA (US)

(73) Assignee: The Boeing Company, Chicago, IL (US)

( * ) Notice: Subject to any disclaimer, the term of this patent is extended or adjusted under 35 U.S.C. 154(b) by 84 days.

(21) Appl. No.: 13/960,354

(22) Filed: Aug. 6, 2013

(65) Prior Publication Data

US 2014/0097017 A1     Apr. 10, 2014

Related U.S. Application Data

(60) Provisional application No. 61/712,201, filed on Oct. 10, 2012.

(51) Int. Cl.
*H05K 9/00* (2006.01)
*B64C 1/14* (2006.01)
*B64D 45/00* (2006.01)

(52) U.S. Cl.
CPC ............ *B64C 1/1484* (2013.01); *B64C 1/1476* (2013.01); *B64C 1/1492* (2013.01); *B64D 45/00* (2013.01); *H05K 9/0005* (2013.01); *Y10T 428/24752* (2015.01)

(58) Field of Classification Search
CPC .................................................. H05K 9/0005

USPC .................................................. 174/381, 389
See application file for complete search history.

(56) References Cited

U.S. PATENT DOCUMENTS

| | | | |
|---|---|---|---|
| 2,497,507 A | 2/1950 | McMaster | |
| 2,640,904 A | 6/1953 | Gaiser | |
| 4,284,677 A | 8/1981 | Herliczek | |
| 5,670,742 A * | 9/1997 | Jones | 174/384 |
| 6,787,204 B2 * | 9/2004 | Chaussade et al. | 428/34 |
| 2011/0110120 A1 | 5/2011 | Briggs | |
| 2012/0217346 A1 * | 8/2012 | Eberle et al. | 244/129.3 |
| 2014/0097018 A1 * | 4/2014 | Russell | 174/389 |

FOREIGN PATENT DOCUMENTS

FR     2793106     3/2000
WO     2011132349     10/2011

OTHER PUBLICATIONS

International Search Repoert and Written Opinion dated Jun. 11, 2014 in co-pending PCT Patent Application No. PCT/US2013/061602.

* cited by examiner

*Primary Examiner* — Hung V Ngo
(74) *Attorney, Agent, or Firm* — Joseph M. Rolnicki; Evans & Dixon, L.L.C.

(57) ABSTRACT

A flight deck aircraft window 10 has improved transparency from two layers of different types of glass and electromagnetic radiation shielding from a thin layer of indium tin oxide between the two layers of glass. The thin layer of indium tin oxide provides the required shielding without appreciably adding to the window weight or detracting from the enhanced transparency of the two layers of glass.

15 Claims, 8 Drawing Sheets

INFRARED LIGHT ENABLED AND ELECTROMAGNETIC SHIELDING AIRCRAFT WINDOW

This patent application claims the benefit of the filing date of provisional patent application No. 61/712,201, filed on Oct. 10, 2012.

FIELD

The present invention pertains to an aircraft window and in particular a flight deck aircraft window having enhanced transparency to visible and infrared light and having shielding against electromagnetic radiation transmission through the window.

BACKGROUND

In aircraft construction it is essential that the aircraft windows have structural strength and good transparency. This is especially true of the flight deck windows which must be structurally strong to withstand impacts, for example from bird strikes, and provide the flight crew with good visibility around the nose of the aircraft.

In aircraft it is essential that the flight deck windows have strength, good transparency, and in some aircraft, shielding against electromagnetic radiation.

However, the electromagnetic shielding added to the flight deck windows of an aircraft can detract from the transparency of the windows.

SUMMARY

The disadvantages associated with conventional aircraft flight deck windows that include electromagnetic shielding are overcome by the flight deck window of the invention. The window is constructed of two layers of different types of glass that improve the transparency of the window to visible light and infrared light. In the most preferred embodiment one layer of glass is water white glass and the second layer of glass is a glass other than water white glass, for example Herculite® glass produced by Pittsburgh Plate Glass Company.

To provide the flight deck window with electromagnetic radiation shielding, a thin layer of shielding material extends across the two layers of glass. In the preferred embodiment the shielding material is indium tin oxide. A thin layer of indium tin oxide can provide the required shielding without appreciably adding to the window weight or detracting from the enhanced transparency of the two layers of glass.

A conductor extends around the peripheral edge of the aircraft window and communicates electrically with the layer of indium tin oxide. With the aircraft window installed on an aircraft, the conductor grounds the layer of indium tin oxide to a portion of the aircraft to which the window is connected, for example the aircraft frame or fuselage. Electromagnetic radiation directed toward the window is intercepted by the layer of indium tin oxide and the energy produced by the radiation is conducted from the layer of indium tin oxide through the conductor surrounding the window and then to the aircraft frame or fuselage where the energy is dissipated.

A bead is provided around the peripheral edge of the aircraft window. The bead extends completely around the aircraft window peripheral edge and is positioned inboard of the conductor that surrounds the window. A portion of the electrical conductor overlaps the bead. The bead ensures contact of the electrical conductor and the aircraft frame or fuselage without interfering with the seal between the window and the portion of the aircraft to which the window is attached. Additionally, the portion of the electrical conductor overlapping the bead ensures good electric communication between the layer of indium tin oxide and the portion of the aircraft to which the aircraft window is attached.

Aircraft windows typically have electrical devices installed in the windows, for example sensors that sense a condition of the window such as temperature, and devices for addressing the condition such as heater elements. These electrical devices communicate through wiring and electric terminal connections with other devices, for example condition monitors or a power source that are separate from the window. In windows with electrical devices the wiring and electric terminals can function as an antenna to electromagnetic radiation.

The aircraft window of the invention includes an electrical connector on the window that is electrically connected through the wiring to the electrical devices of the window. The electrical connector is contained in a terminal block where all wiring is electromagnetically shielded. The terminal block unites all shielded wiring with the electrical connector and prevents the wiring and electrical connector from functioning as an electromagnetic radiation antenna.

BRIEF DESCRIPTION OF THE DRAWINGS

Further features of the aircraft window of the invention are set forth in the following detailed description of the aircraft window and in the drawing figures.

DESCRIPTION

Figure 1:
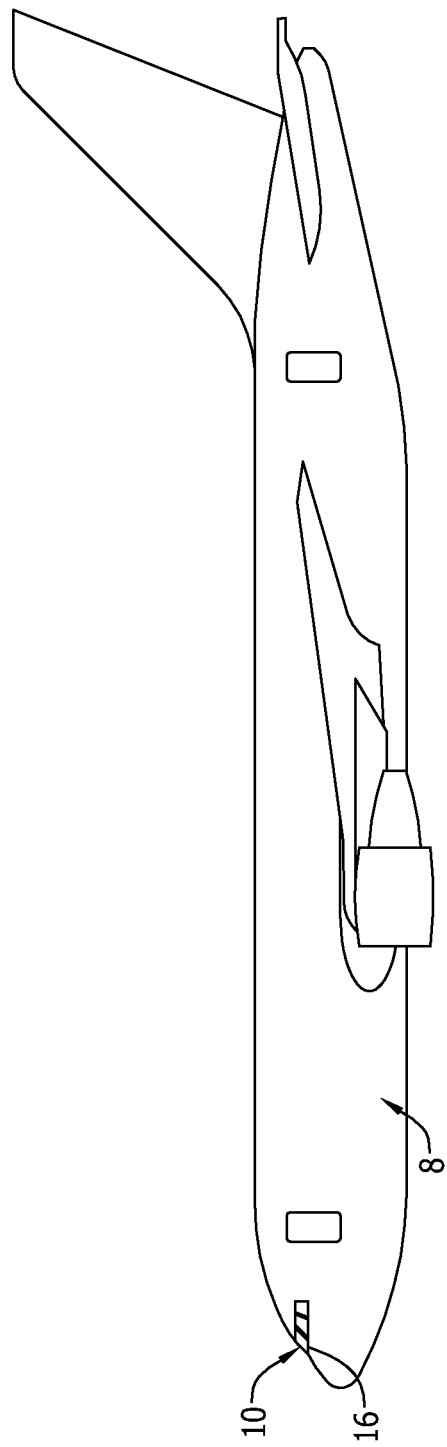
FIG. 1 is a representation of a side elevation view of an aircraft employing the infrared light enabled and electromagnetic shielding aircraft window of the invention.

FIG. 1 is a representation of a side elevation view of an aircraft 8 employing the window 10 of the invention. In a preferred embodiment, the aircraft window 10 is one of the pair of forward most flight deck windows on the aircraft 8.

Figure 2:
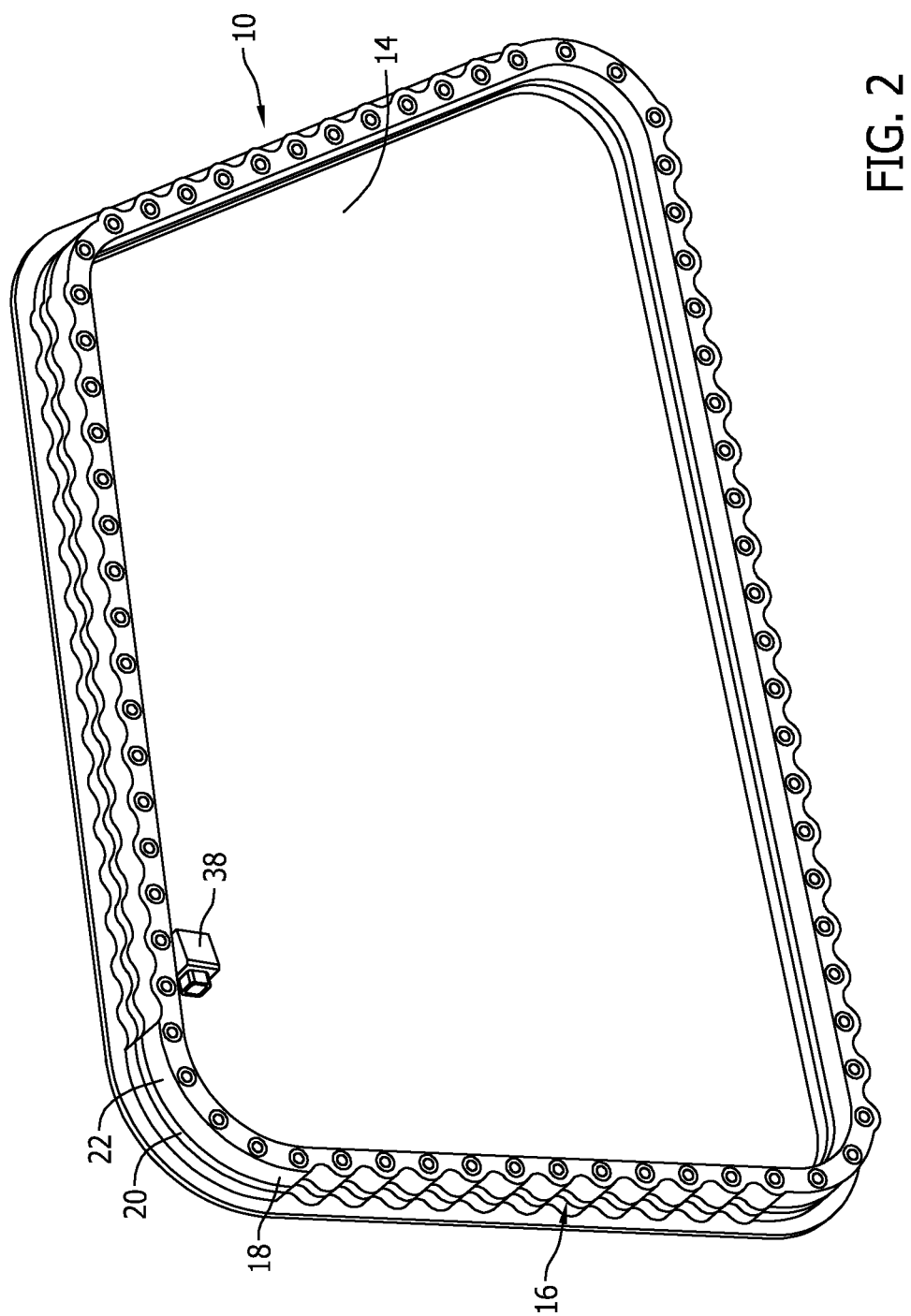
FIG. 2 is a perspective view of the aircraft window of the invention.
Figure 3:
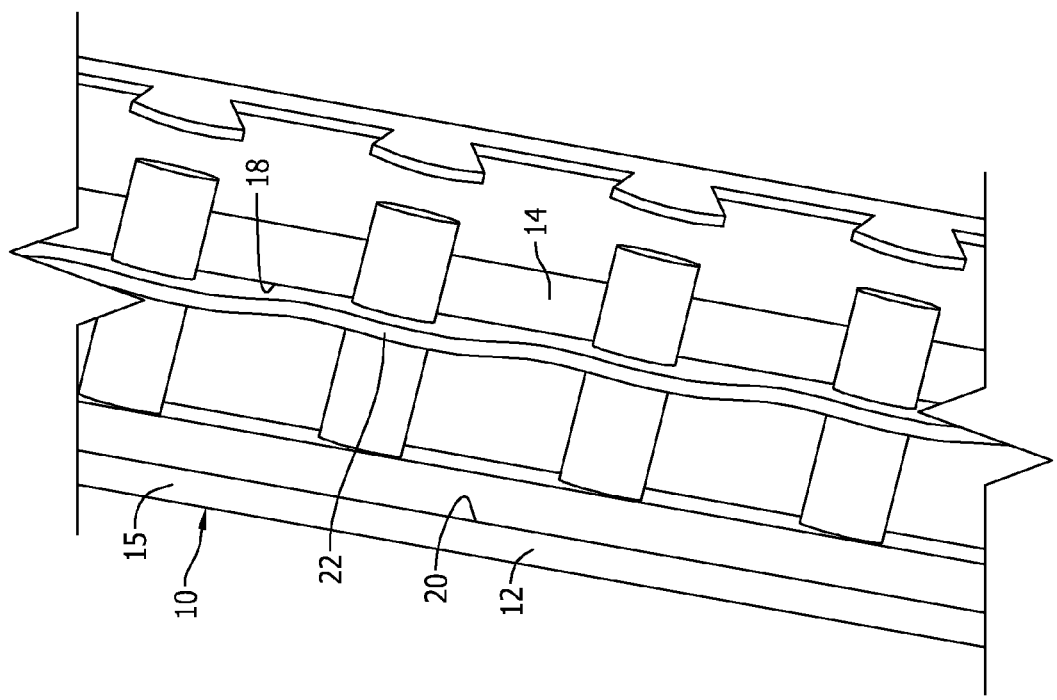
FIG. 3 is a partial cross section view of the aircraft window that has been enlarged.

FIG. 2 is a representation of a perspective view of the aircraft window 10 of the invention. FIG. 3 is a cross section view of the window. The aircraft window 10 is basically comprised of a first sheet of glass 12 forming a first glass layer, and a second sheet of glass 14 forming a second glass layer. The first glass layer 12 and the second glass layer 14 are co-extensive across the window 10. Peripheral edges of the first glass layer 12 and the second glass layer 14 overlap forming a peripheral edge 16 of the aircraft window 10. In the preferred embodiment of the aircraft window, one of the layers of glass 12, 14 is water white glass. In the most preferred embodiment of the aircraft window the first glass layer 12 is water white glass and the second layer of glass 14 is a type of glass other than water white glass. In the most preferred embodiment of the aircraft window 10, the first layer of glass 12 is water white glass and the second layer of glass 14 is Herculite® glass produced by Pittsburgh Plate Glass Company (PPG Aerospace). Additionally, when the aircraft window 10 is installed on an aircraft, the window has an outboard side that faces an exterior of the aircraft and an opposite inboard side that faces toward the interior of the aircraft. In the preferred embodiment, the first glass layer 12 is proximate the outboard side of the aircraft window 10 and the second glass layer 14 is proximate the inboard side of the aircraft window.

Referring to FIG. 3 which shows an enlarged, partial cross-section view of the aircraft window 10, a thin layer of electromagnetic radiation shielding material 18 is shown between the first glass layer 12 and the second glass layer 14. The layer of electromagnetic shielding material 18 extends across the two layers of glass 12, 14 to the peripheral edge 16 of the window. In a preferred embodiment of the aircraft window 10 the thin layer of electromagnetic radiation shielding material is indium tin oxide. Indium tin oxide is transparent and colorless in thin layers. It is electrically conductive and optically transparent. In one embodiment of the windows the layer of indium tin oxide is applied to the outboard surface 18 of the second glass layer 14. In another embodiment the layer of indium tin oxide is applied to the inboard surface 20 of the outer most glass layer 15. As shown in FIG. 3, the layer of indium tin oxide 18 is positioned between the first glass layer 12 and the second glass layer 14. The thin layer of indium tin oxide 18 provides the aircraft window 10 with the required shielding from electromagnetic radiation without appreciably adding to the window weight or detracting from the enhanced transparency of the first glass layer 12 and second glass layer 14.

A layer of adhesive 22 is also positioned between the first glass layer 12 and the second glass layer 14. The layer of adhesive 22 extends completely across the two glass layers 12, 14 and secures together the first glass layer 12 and the second glass layer 14 with the layer of indium tin oxide 18 therebetween. In a preferred embodiment the layer of adhesive 22 is polyvinyl butyral (or PVB). PVB is a resin that is often used in applications that require strong binding, optical clarity, adhesion to many surfaces, toughness and flexibility.

Figure 4:
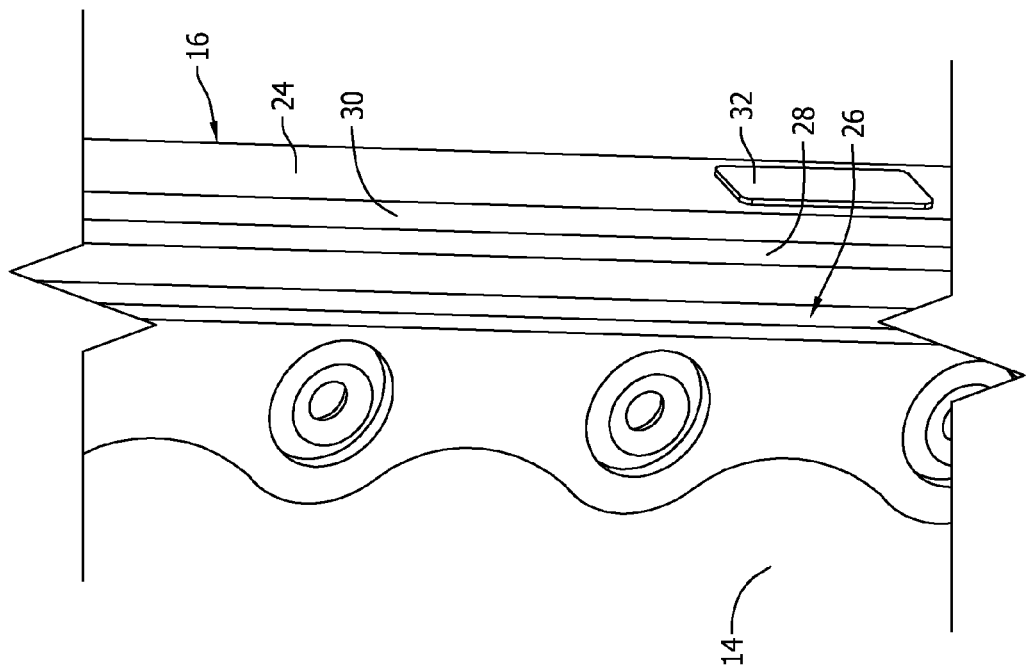
FIG. 4 is a partial view of a section of the aircraft window peripheral edge that has been enlarged.

Referring to FIGS. 2 and 4, an electrical conductor 24 extends along the window peripheral edge 16. In a preferred embodiment of the aircraft window 10, the electrical conductor 24 extends completely around the window peripheral edge 16. Also, in a preferred embodiment of the aircraft window 10, the electrical conductor 24 is a foil strip, for example tin foil or tin plated copper foil. The electrical conductor 24 on the window peripheral edge 16 communicates electrically with the layer of indium tin oxide 18. The electrical conductor 24 is positioned on the window peripheral edge 16 so that, when the aircraft window 10 is installed on an aircraft the electrical conductor 24 provides an electrically conductive connection to the portion of the aircraft to which it is attached, for example the aircraft frame or the fuselage. Thus, the electrical conductor 24 provides an electrically conductive connection between the layer of indium tin oxide 18 in the aircraft window 10 and the portion of the aircraft to which the window is attached. Electromagnetic radiation directed toward the aircraft window 10 is intercepted by the layer of indium tin oxide 18 and the energy produced by the electromagnetic radiation is conducted from the layer of indium tin oxide 18 through the electrical conductor 24 to the aircraft frame or fuselage where the energy is dissipated.

A pressure seal 26 also extends around the aircraft window peripheral edge 16. The pressure seal 26 has a raised contact bead 28 positioned on the outboard side of the electrical conductor 24. In a preferred embodiment of the aircraft window 10 the bead 28 extends completely around the aircraft window peripheral edge 16. A portion 30 of the electrical conductor 24 overlaps the bead 28. This portion 30 of the electrical conductor 24 overlapping the bead 28 ensures good electrically conductive communication from the layer of indium tin oxide 18 to the portion of the aircraft to which the aircraft window 10 is attached without interfering with sealing the aircraft window on the portion of the aircraft. The sealing of the aircraft window by the pressure seal 26 and the contact bead 28 is designed to withstand the repeated pressurization and depressurization of the aircraft that the window will endure during the useful life of the aircraft.

An electrical check pad 32 is provided on the electrical conductor 24. The electrical check pad 32 is a monitoring device, for example an electrical resistance monitoring device that ensures there is good electrical conductivity between the electrical conductor 24 and the portion of the aircraft to which the aircraft window 10 is attached. Although only one electrical check pad 32 is shown in FIG. 4, there could be two or more electrical check pads spaced around the aircraft window peripheral edge 16.

Figure 5:
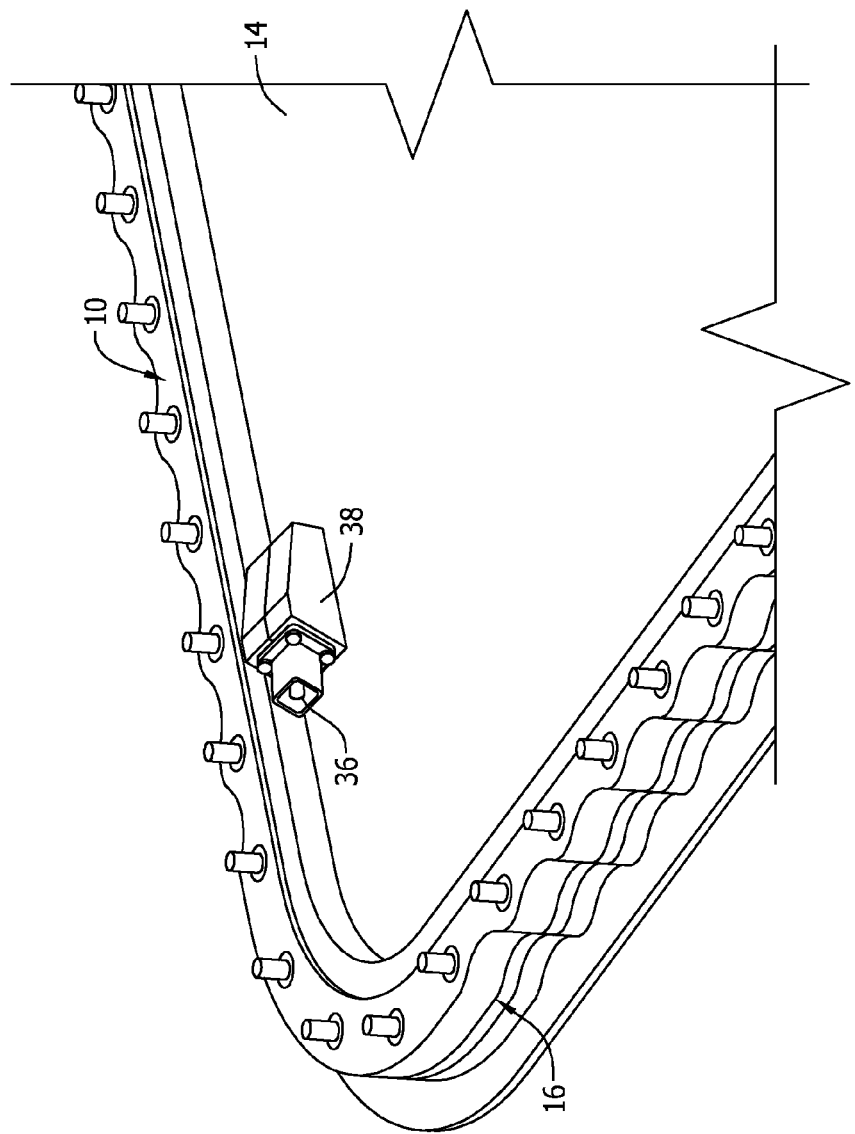
FIG. 5 is a partial view of a section of the aircraft window peripheral edge and a terminal block that have been enlarged.

As in conventional aircraft, the aircraft window 10 has electrical devices installed in the window, for example sensors that sense a condition of the window such as temperature and devices for addressing the condition such as anti-ice heating film. These electrical devices typically communicate through wiring with an electric connector on the window. An example of such an electric connector or electric terminal 36 is shown in FIG. 5. The electric terminal 36 is removably connectable to other conductors in the aircraft that communicate the electrical devices in the aircraft window 10 with other electrical devices of the aircraft, for example a condition monitor such as a temperature monitor and/or a power source that provides power to anti-ice heating film in the window.

As represented in FIG. 5, the aircraft window 10 is provided with a terminal block 38 that contains the electric connector 36. The terminal block 38 unites shielded electric connector 36 and the shielded wiring connected to the electric connector and prevents the terminal and wiring from functioning as an antenna to electromagnet radiation.

As described above, the construction of the flight deck aircraft window 10 has improved transparency from two layers of different types of glass and electromagnetic radiation shielding from a thin layer of indium tin oxide that provides the required shielding without appreciably adding to the window weight or detracting from the enhanced transparency of the two layers of glass.

Figure 6:
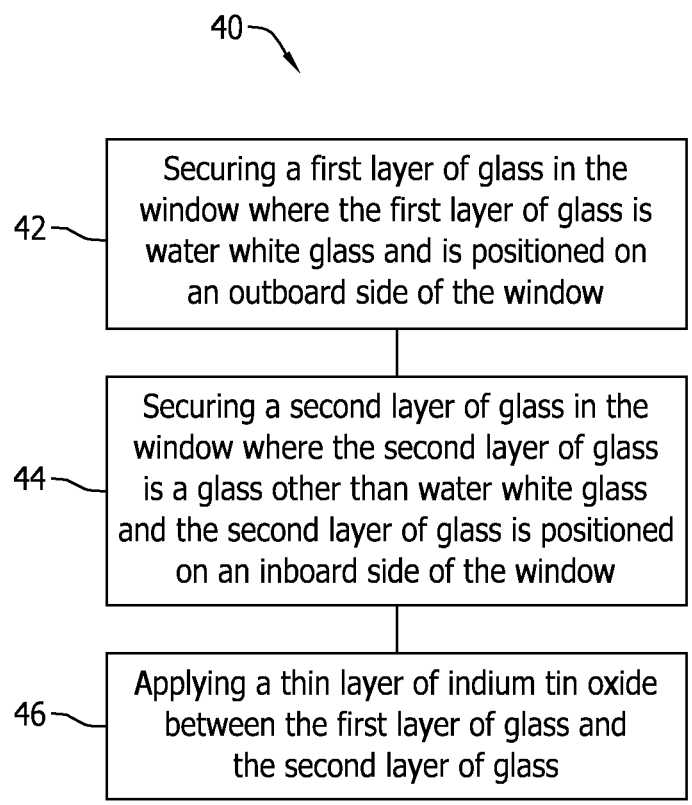
FIG. 6 is a flow chart illustrating an embodiment of a method of assembling or manufacturing the aircraft window.

FIG. 6 is a flow chart of an embodiment of a method 40 of assembling or manufacturing the aircraft window 10. Basically, the method of manufacturing the window 40 may involve a step 42 of securing the first layer of glass 12 in the window 10 where the first layer of glass is water white glass and is positioned on an outboard side of the window. The manufacturing method may also include a step 44 of securing the second layer of glass 14 in the window 10 where the second layer of glass is a glass other than water white glass and the second layer of glass is positioned on an inboard side of the window. Additionally, the method of manufacturing the window 10 may include a step 46 of applying a thin layer of indium tin oxide 18 on the second glass layer 14.

Figure 7:
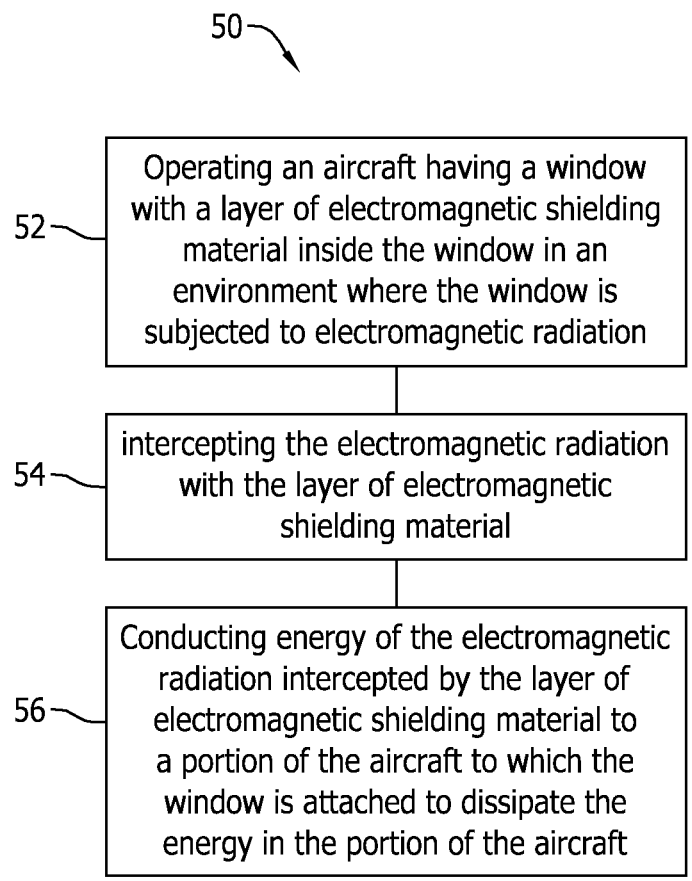
FIG. 7 is a flow chart illustrating an embodiment of a method of using the aircraft window.

FIG. 7 is a flow chart 50 illustrating the earlier described steps involved in the method of using the aircraft window 10 to dissipate electromagnetic radiation directed at the aircraft.

The method 50 basically involves a step 52 of operating the aircraft 8 in an environment where the aircraft window 10 will be subjected to electromagnetic radiation. The method 50 also involves a step 54 of intercepting the electromagnetic radiation directed toward the aircraft window 10 with the layer of electromagnetic shielding material 18. In a further step 56 of the method 50 the energy generated by the electromagnetic radiation intercepted by the layer of electromagnetic shielding material 18 is conducted to a portion of the aircraft to which the window 10 is attached to dissipate the energy in the portion of the aircraft.

Figure 8:
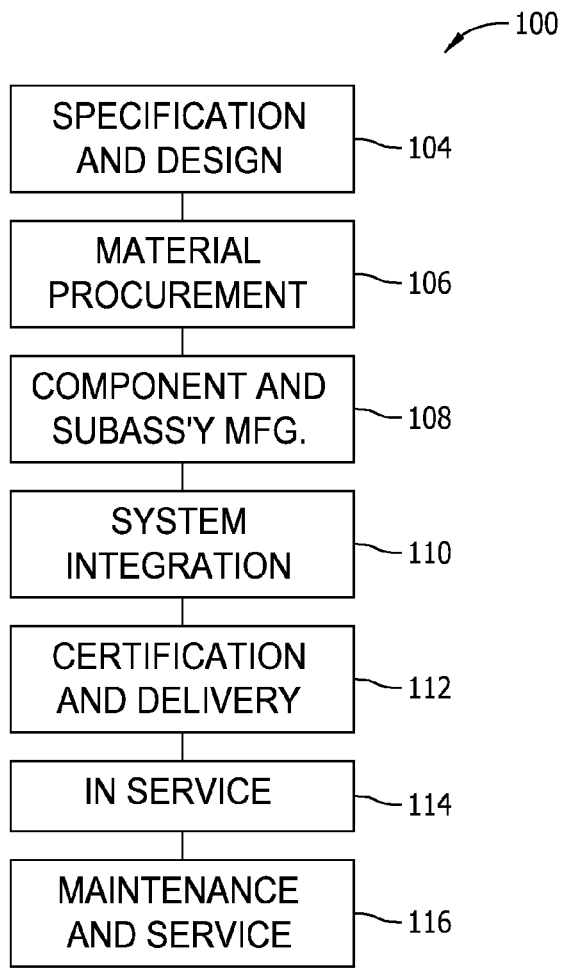
FIG. 8 is a flow diagram of an aircraft manufacturing and service methodology.
Figure 9:
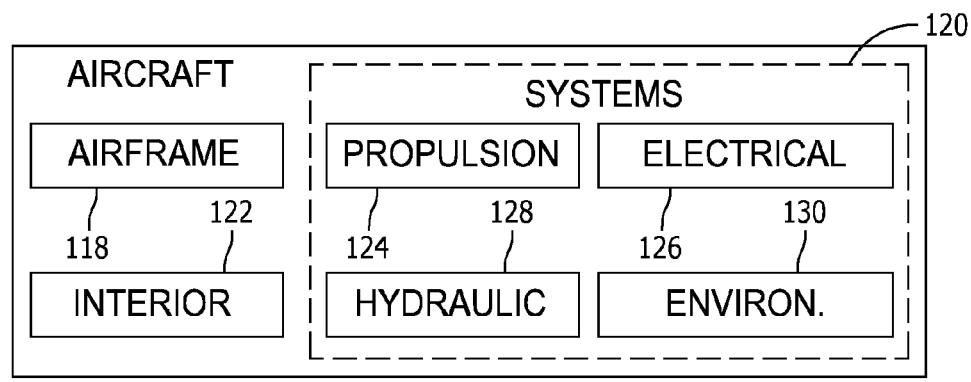
FIG. 9 is a block diagram of an aircraft.

Referring to FIGS. 8 and 9, embodiments of the disclosure may be described in the context of an aircraft manufacturing and service method 100 as shown in FIG. 8 and an aircraft 102 as shown in FIG. 9. During pre-production, exemplary method 100 may include specification and design 104 of the aircraft 102 and material procurement 106. During production, component and subassembly manufacturing 108 and system integration 110 of the aircraft 102 takes place. Thereafter, the aircraft 102 may go through certification and delivery 112 in order to be placed in service 114. While in service by a customer, the aircraft 102 is scheduled for routine maintenance and service 116 (which may also include modification, reconfiguration, refurbishment, and so on).

Each of the processes of method 100 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 9, the aircraft 102 produced by exemplary method 100 may include an airframe 118 with a plurality of systems 120 and an interior 122. Examples of high-level systems 120 include one or more of a propulsion system 124, an electrical system 126, a hydraulic system 128, and an environmental system 130. Any number of other systems may be included. Although an aerospace example is shown, the principles of the invention may be applied to other industries, such as the automotive industry.

Apparatus and methods embodied herein may be employed during any one or more of the stages of the production and service method 100. For example, components or subassemblies corresponding to production process 108 may be fabricated or manufactured in a manner similar to components or subassemblies produced while the aircraft 102 is in service. Also, one or more apparatus embodiments, method embodiments, or a combination thereof may be utilized during the production stages 108 and 110, for example, by substantially expediting assembly of or reducing the cost of an aircraft 102. Similarly, one or more of apparatus embodiments, method embodiments, or a combination thereof may be utilized while the aircraft 102 is in service, for example and without limitation, to maintenance and service 116.

Although the apparatus of the invention and its method of use have been described by reference to a particular embodiment of the apparatus, it should be understood that modifications and variations to the apparatus and method could be made without departing from the intended scope of the claims appended hereto.

The invention claimed is:

1. An aircraft window comprising:
a first glass layer extending across the aircraft window, the first glass layer being water white glass;
a second glass layer extending across the aircraft window, the second glass layer overlapping the first glass layer, the second glass layer being a glass that is different from water white glass;
the aircraft window having a peripheral edge around the aircraft window;
a layer of electromagnetic shielding material extending across the aircraft window between the first and second glass layers, the layer of electromagnetic shielding material extending to the aircraft window peripheral edge and completely around the aircraft window peripheral edge; and,
an electrical conductor on the aircraft window peripheral edge, the electrical conductor extending completely around the aircraft window peripheral edge, the electrical conductor being connected in electric communication with the layer of electromagnetic shielding material completely around the aircraft window peripheral edge.

2. The aircraft window of claim 1, further comprising:
a layer of adhesive between the first glass layer and the second glass layer, the layer of adhesive contacting both the first glass layer and the second glass layer and securing together the first glass layer and the second glass layer.

3. The aircraft window of claim 1, further comprising:
the aircraft window having an outboard side that faces an exterior of an aircraft on which the aircraft window is installed, and an opposite inboard side that faces an interior of the aircraft on which the aircraft window is installed;
the first glass layer is proximate the outboard side of the aircraft window and the second glass layer is proximate the inboard side of the aircraft window.

4. The aircraft window of claim 1, further comprising:
the layer of electromagnetic shielding material is on the second glass layer.

5. The aircraft window of claim 1, further comprising:
the layer of electromagnetic shielding material is indium tin oxide.

6. The aircraft window of claim 1, further comprising:
the electrical conductor being connectable in electric communication to a portion of an aircraft on which the aircraft window is used and thereby ground the layer of electromagnetic shielding material through the electrical conductor to the portion of the aircraft.

7. The aircraft window of claim 6, further comprising:
a contact bead on the peripheral edge adjacent the electrical conductor, the contact bead ensures the electrical conductor being connected in electric communication with the portion of the aircraft on which the window is used without interfering with sealing the aircraft window on the portion of the aircraft on which the window is used.

8. The aircraft of claim 6, further comprising:
an electrical check pad on the peripheral edge, the electrical check pad being operable to monitor the electrical conductivity between the electrical conductor and the portion of the aircraft.

9. The aircraft window of claim 1, further comprising:
an electric connector on the aircraft window, the electric connector being connected to wiring of an electrical device on the aircraft window; and,
electromagnetic shielding surrounding the wiring within a terminal block.

10. An aircraft window comprising:
a first glass layer extending across the aircraft window;
a second glass layer extending across the aircraft window;

a layer of indium tin oxide extending across the aircraft window;

the aircraft window having a peripheral edge around the aircraft window;

the first glass layer extending across the aircraft window to the peripheral edge;

the second glass layer extending across the aircraft window to the peripheral edge;

the layer of indium tin oxide extending across the aircraft window to the peripheral edge and completely around the peripheral edge;

an electrical conductor on the peripheral edge, the electrical conductor extending completely around the peripheral edge, the electrical conductor being connected in electric communication with the layer of indium tin oxide completely around the peripheral edge.

11. The aircraft window of claim 10, further comprising:

the electrical conductor being connectable in electric communication to a portion of an aircraft on which the aircraft window is used and thereby ground the layer of indium tin oxide through the electrical conductor to the portion of the aircraft.

12. The aircraft window of claim 11, further comprising:

a contact bead on the peripheral edge adjacent the electrical conductor, the contact bead ensures the electrical conductor being connected in electric communication with the portion of the aircraft on which the aircraft window is used without interfering with sealing the aircraft window on the portion of the aircraft on which the window is used.

13. The aircraft window of claim 11, further comprising:

an electrical check pad on the peripheral edge, the electrical check pad being operable to monitor the electric conductivity between the electrical conductor and the portion of the aircraft.

14. The aircraft window claim 10, further comprising:

the aircraft window having an outboard side that faces an exterior of an aircraft on which the aircraft window is installed, and an opposite inboard side that faces an interior of the aircraft on which the aircraft window is installed;

the first glass layer is proximate the outboard side of the aircraft window and the second glass layer is proximate the inboard side of the aircraft window; and, the layer of indium tin oxide is on the second glass layer.

15. The aircraft window of claim 10, further comprising:

an electric connector on the aircraft window, the electric connector being connected to wiring of an electrical device on the aircraft window; and, electromagnetic shielding surrounding the wiring within a terminal block.

* * * * *